United States Patent
Poss

(10) Patent No.: US 6,960,907 B2
(45) Date of Patent: Nov. 1, 2005

(54) EFFICIENT LOW DROPOUT LINEAR REGULATOR

(75) Inventor: Joe M. Poss, Rochester, MN (US)

(73) Assignee: Hitachi Global Storage Technologies Netherlands, B.V., (NL)

( * ) Notice: Subject to any disclaimer, the term of this patent is extended or adjusted under 35 U.S.C. 154(b) by 0 days.

(21) Appl. No.: 10/789,774

(22) Filed: Feb. 27, 2004

(65) Prior Publication Data

US 2005/0189934 A1 Sep. 1, 2005

(51) Int. Cl.[7] .............................................. G05F 3/26
(52) U.S. Cl. ...................................... 323/316; 323/273
(58) Field of Search ................................ 323/273, 374, 323/280, 313–316

(56) References Cited

U.S. PATENT DOCUMENTS

| | | | |
|---|---|---|---|
| 3,984,780 A * | 10/1976 | Hsiao et al. ................. 330/253 |
| 4,908,566 A | 3/1990 | Tesch | |
| 5,168,209 A | 12/1992 | Thiel, V | |
| 5,631,598 A * | 5/1997 | Miranda et al. ............ 327/540 |
| 5,637,992 A | 6/1997 | Edwards | |
| 5,648,718 A | 7/1997 | Edwards | |
| 5,744,944 A | 4/1998 | Danstrom | |
| 5,850,139 A | 12/1998 | Edwards | |
| 5,945,818 A | 8/1999 | Edwards | |
| 5,982,226 A | 11/1999 | Rincon-Mora | |
| 6,246,221 B1 * | 6/2001 | Xi ............................... 323/280 |
| 6,522,112 B1 | 2/2003 | Schmoock et al. | |
| 6,573,694 B2 * | 6/2003 | Pulkin et al. ................ 323/273 |
| 6,586,987 B2 * | 7/2003 | Somerville et al. ......... 327/542 |
| 6,646,495 B2 * | 11/2003 | Perez .......................... 327/541 |

* cited by examiner

Primary Examiner—Gary L Laxton
(74) Attorney, Agent, or Firm—Townsend and Townsend and Crew LLP

(57) ABSTRACT

A linear voltage regulator circuit includes an external pass transistor that does not rely on internal compensation, provides high gain, and exhibits reduce silicon area and power requirements. Circuits according to the present invention provide sufficient bandwidth with an error amplifier and drive capability to keep any secondary poles sufficiently far from the unity gain bandwidth (UGB) while maintaining good power supply rejection.

29 Claims, 6 Drawing Sheets

EFFICIENT LOW DROPOUT LINEAR REGULATOR

CROSS-REFERNCE TO RELATED APPLICATION

The present invention is related to co-pending U.S. application Ser. No. 10/788,433, filed Feb. 27, 2004 and is herein incorporated by reference in its entirety for all purposes.

BACKGROUND OF THE INVENTION

The present invention relates generally to analog circuits, and in particular low dropout linear regulators and systems which incorporate low dropout linear regulators.

Most linear regulators have feedback which needs some type of stability compensation, either external or internal compensation. To obtain more precise voltage regulation, larger gain is required which inherently makes the feedback less stable. These two trade-offs, large gain and stability, create a design challenge. Other design considerations require low current, reduced silicon area, and good power supply rejection. Many techniques have been implemented for stability compensation. The following patents constitute a sampling of conventional solutions: U.S. Pat. Nos. 4,908,566, 5,168,209, 5,637,992, 5,648,718, 5,744,944, 5,850,139, 5,945,818, 5,982,226, and 6,522,112. All of these techniques use some type of internal zero compensation.

FIG. 3 shows a simplified open loop transfer function of a linear regulator. A regulator with feedback becomes unstable if the open loop gain is >0 dB and the phase is –180 degrees. This condition occurs if at least 2 poles exist below the unity gain bandwidth (UGB). The zero compensation method from the cited patents essentially adds 90 degrees back to the transfer function and keeps the loop stable. Methods to add zero compensation typically increase the power requirement of the circuit and increase the silicon area, especially if large capacitors are needed in silicon.

The $P_0$ pole in FIG. 3 is typically caused by a main compensating load capacitor $C_1$, as shown in FIG. 4. $P_a$ of FIG. 3 represents a secondary pole that can be caused by parasitic capacitive loading ($C_{p1}$) at the gate of $T_1$ or by a parasitic capacitance ($C_{p2}$) at the base of $T_{pass}$, or even by the OpAmp itself. In general, a circuit arrangement can cause stability problems if at least 2 poles exist below the UGB (i.e., less than the unity gain frequency) and no zero compensation is provided.

In essence there are many places where secondary poles can exist. As in FIG. 4, nodes $V_1$, $V_3$, $V_f$, $V_{out}$ and the OpAmp are potential areas where poles exist. Node $V_3$, however, can be the most difficult node to keep sufficiently low in parasitic capacitance, since it has to drive off the chip and at the base of the Pass transistor resulting in 10's of pF's.

The other traditional method of stability compensation is to rely on the ESR (equivalent series resistance) of the load capacitor. The ESR of the load capacitor can provide a compensating zero to offset the extra pole in the feedback typically from the amplifier stage. The issue with relying on the ESR of the capacitor is there can be a narrow range of ESR values allowed for a given design.

There is need for an integrated linear regulator have relatively large gain while maintaining stability, with reduced chip layout area and reduced power consumption.

SUMMARY OF THE INVENTION

The present invention is directed to a linear regulator and circuits incorporating a linear regulator. A typical linear circuit according to the invention includes an external pass transistor that does not rely on internal compensation, provides high gain, and exhibits reduced silicon area and power requirements. Circuits according to the present invention provide sufficient bandwidth with an error amplifier and drive capability to keep any secondary poles sufficiently far from the unity gain bandwidth (UGB) while maintaining good power supply rejection. In accordance with the invention operation of the circuit does not rely on the equivalent series resistance (ESR) of the load capacitor.

BRIEF DESCRIPTION OF THE DRAWINGS

Aspects, advantages and novel features of the present invention will become apparent from the following description of the invention presented in conjunction with the accompanying drawings, wherein.

DESCRIPTION OF THE SPECIFIC EMBODIMENTS

Figure 4:
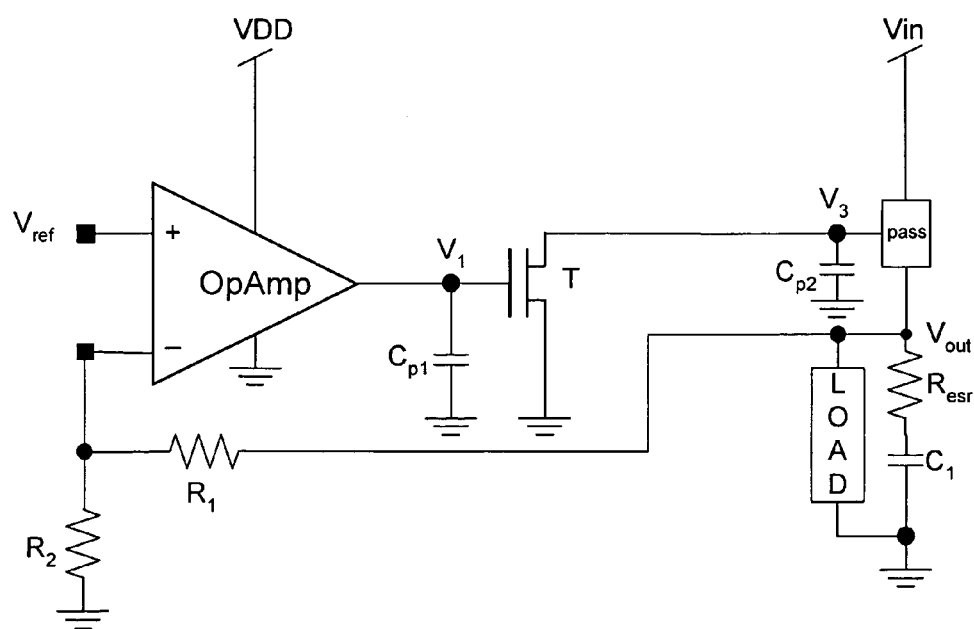
FIG. 4 shows a typical linear regulator circuit.

Circuits embodied in accordance with the present invention keep the secondary poles beyond the UGB. See FIG. 2 for example. $P_b$ represents a secondary pole in the system. As long as the secondary poles are sufficiently beyond the UGB (i.e., greater than the unity gain frequency), the regulator will be stable. There are many places where secondary poles can exist. As can be seen in FIG. 4, for example, nodes $V_1$, $V_3$, $V_f$, $V_{out}$ and the OpAmp are potential areas where poles exist. Node $V_3$, however, can be an especially difficult node to keep sufficiently low in parasitic capacitance, since it has to drive off the chip and at the base of the pass transistor $T_{pass}$, resulting in capacitance of tens of pF's.

Figure 1:
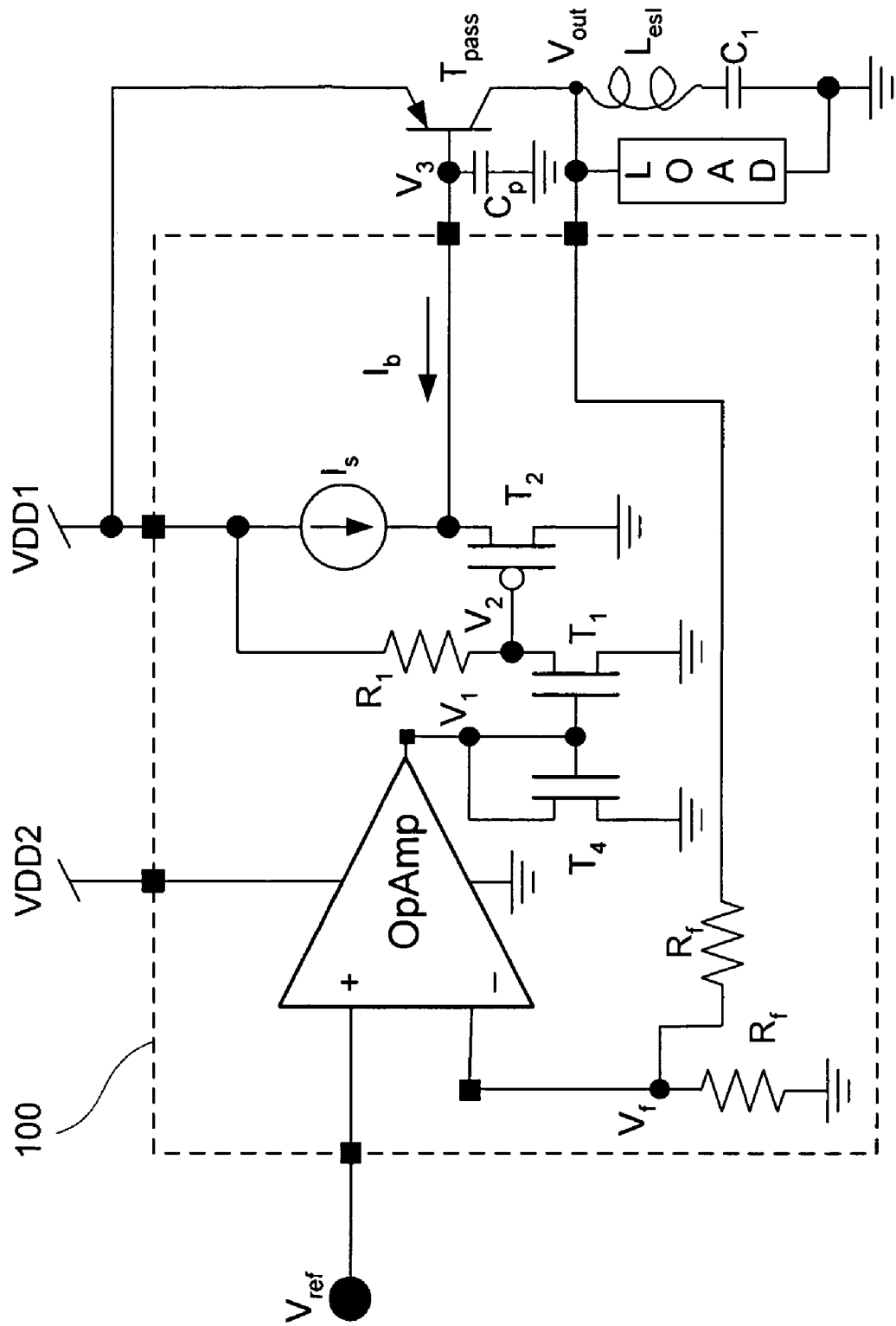
FIG. 1 shows an illustrative embodiment of a linear regulator circuit according to the present invention.
Figure 6:
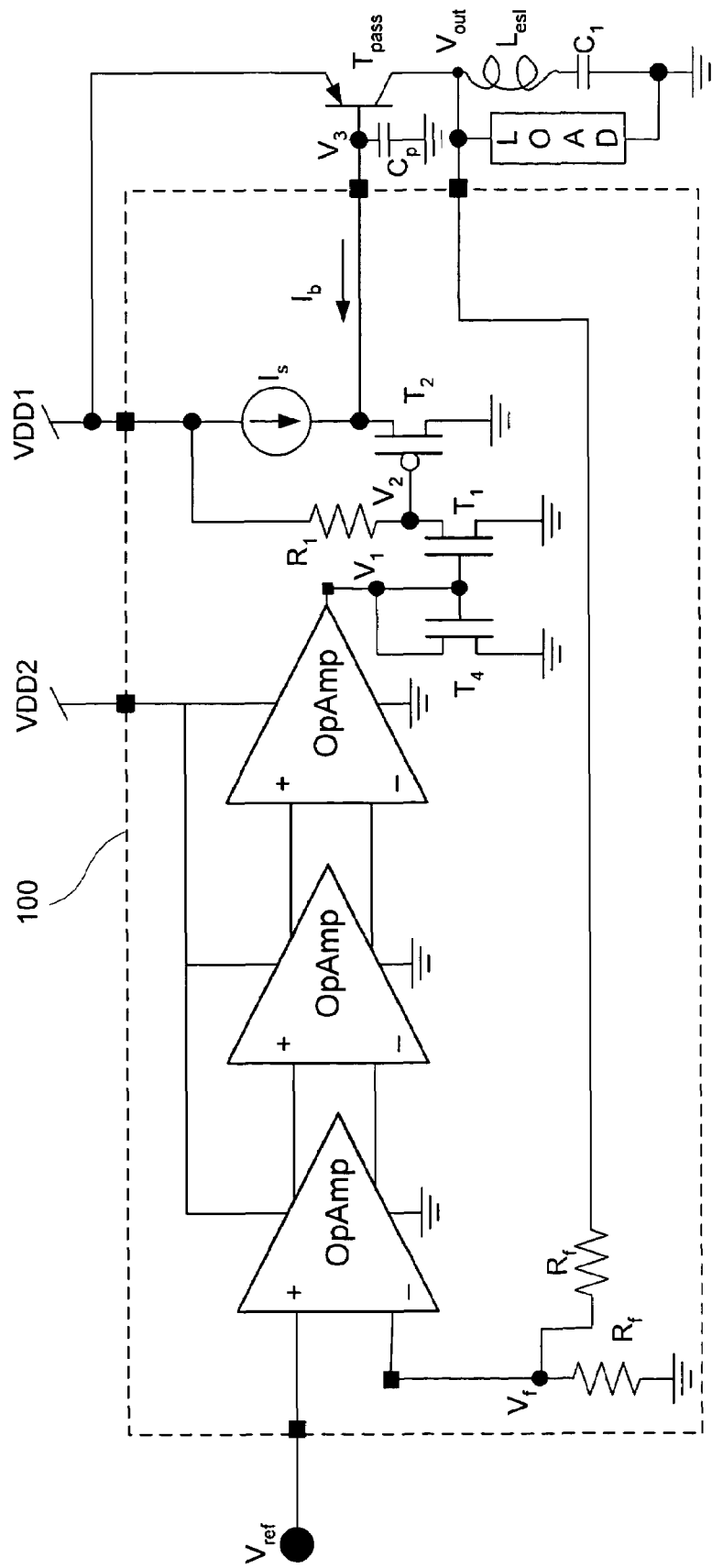
FIG. 6 shows an example of a configuration using multiple OpAmps.

Referring to FIG. 1, a linear regulator 100 includes an error amplifier comprising an OpAmp circuit. In one embodiment, a single conventional OpAmp device is used. The OpAmp includes a non-inverting input that is coupled to a node which receives a reference voltage, $V_{ref}$. The OpAmp includes an inverting input that is coupled to a node $V_f$. An output of the OpAmp is coupled to a node $V_1$. A current mirror circuit comprising transistors $T_4$ and $T_1$ is coupled to the node $V_1$. The OpAmp outputs by way of the node $V_1$ a driving current to the current mirror circuit. A voltage source VDD2 is provided to power the OpAmp. It can be appreciated by those of ordinary skill that alternative embodiments of the invention can incorporate an OpAmp circuit design configured around an arrangement of multiple OpAmp devices. FIG. 6 shows an example of a configuration in which the OpAmp component shown in FIG. 1 comprises multiple OpAmp devices.

A resistor $R_1$ is coupled between a second voltage source VDD1 and the drain of $T_1$, at a node $V_2$. Transistor device $T_2$ is configured as a source follower, having a gate terminal that is connected to the node $V_2$ and a source terminal that is connected to a current source represented schematically as $I_s$. The source terminal of $T_2$ is also coupled to $1_b$ flowing at a node $V_3$. Typical devices used for transistor device $T_2$ include, but are not limited to, P-type FET's (field effect transistors), N-type FET's, NPN BJT's (bipolar junction transistors), and PNP BJT's.

A pass circuit comprising element $T_{pass}$ has a control terminal that is connected to the node $V_3$. The voltage source VDD1 is connected to a first terminal of the pass element $T_{pass}$. The pass element can be any of a number of transistor devices such as a BJT. Though, the embodiment illustrated in FIG. 1 shows the device to be a device that is external to the linear regulator 100, one of ordinary skill will understand that the pass element can be incorporated on-chip.

A second terminal of the pass element $T_{pass}$ is coupled to an output node $V_{out}$ to provide a regulated voltage to a load. A compensating capacitor $C_1$ is coupled across the load. An equivalent series inductance (ESL) of the capacitor is schematically represented. A feedback path from the output node $V_{out}$ to the node $V_f$ is provided through the voltage divider network formed by a pair of resistors $R_f$.

In operation, a circuit according to the invention operates to drive the base node $V_3$ such that the bandwidth at that node is high enough to place a pole beyond the UGB. This ensures stability of the circuit while providing efficient operation for low quiescent current and good power supply rejection. Referring to the illustrative circuit according to the invention, shown in FIG. 1, the output of the OpAmp component is a current which drives the diode-connected mirror of $T_4$ and $T_1$. Transistor device $T_1$, with $R_1$ connected to its drain node, provides gain and a DC operating point at node $V_2$.

As noted above, the transistor device $T_2$ is configured as a source follower and thus operates as a low output impedance gain stage to provide a low impedance drive to node $V_3$. Current source $I_s$ provides a bias current to $T_2$ that is substantially less than the base current, $1_b$. The voltage source VDD1 provides a current to the pass transistor $T_{pass}$ and a common voltage reference to $R_1$. It is noted that the voltage source VDD2 does not have to be the same potential as VDD1. However, in a particular embodiment of the invention VDD2 can be the same potential as VDD1.

Figure 2:
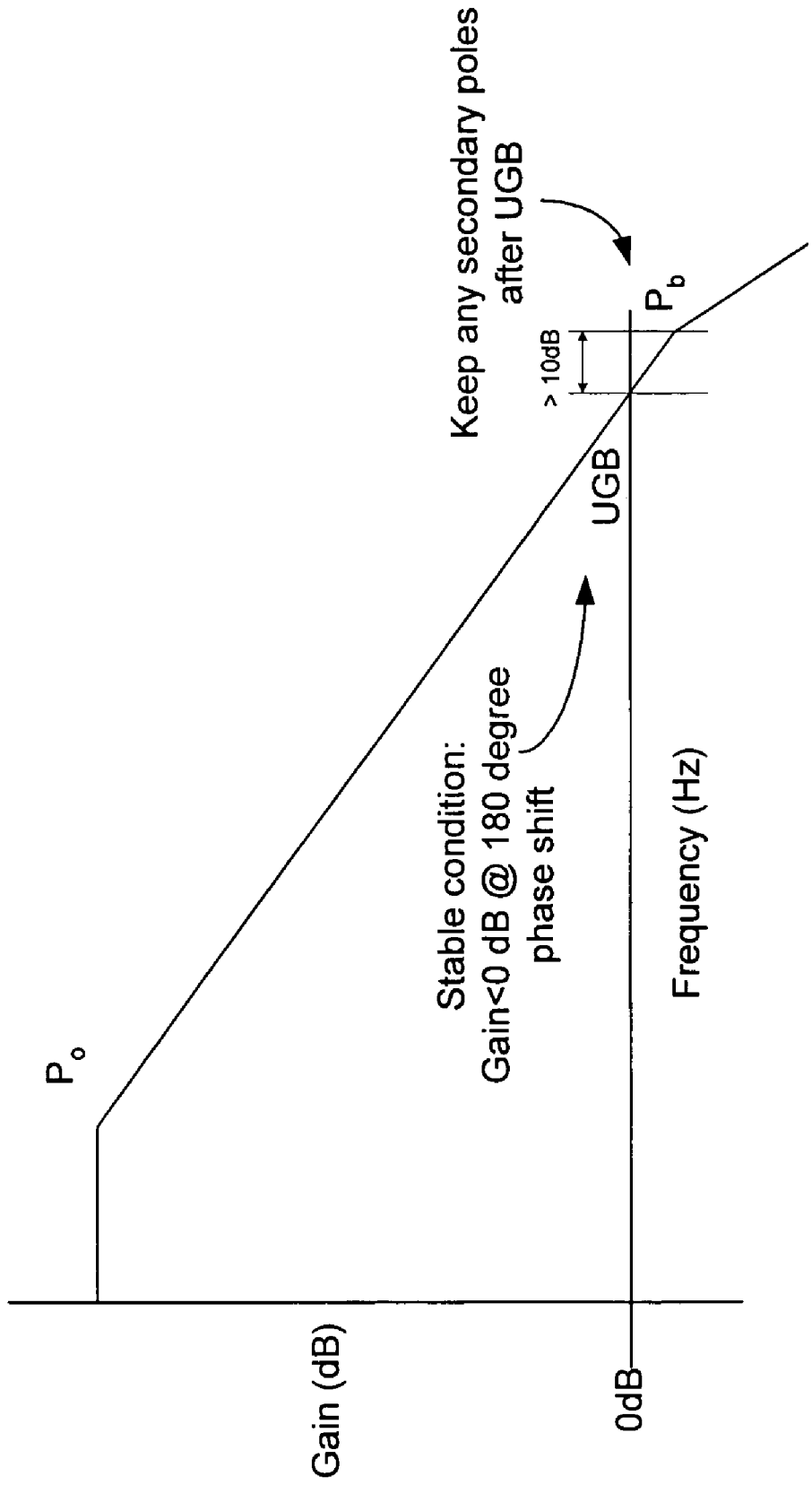
FIG. 2 shows a Bode plot of the behavior of the linear regulator circuit of FIG. 1.

The compensating capacitor $C_1$ provides the pole $P_0$ (see FIG. 2). Because $T_2$ is configured as a source follower, its output impedance is low. Consequently, the source follower output can drive the parasitic capacitance $C_p$ of the pass element $T_{pass}$ that exists on node $V_3$ to provide sufficient bandwidth so that the secondary pole $P_b$ can be located beyond the frequency of the UGB. This effect is shown in FIG. 2, where the second pole is. The current for $T_2$ is provided primarily by the base of the pass element $T_{pass}$. This configuration exhibits certain advantages. For example, since the current required to supply base current to $T_{pass}$ is low during low load current, the quiescent current for the total regulator is low.

Another advantage with this configuration is that the source follower acts as a gain stage with an output impedance that decreases with an increase in load current. The current flow through transistor device $T_2$ increases as the current draw through the load increases. This in turn decreases the output resistance of $T_2$ thus increasing the bandwidth of node $V_3$. More bandwidth at $V_3$ is needed during higher current loads because the pole at $V_{out}$ increases as well with higher current loads. So the poles at $V_3$ and $V_{out}$ track each other despite the load change. This is a desirable characteristic because it ensures stability during high current loads.

$I_s$ is a small current to keep transistor device $T_2$ turned ON when no base current is needed during low current demands of the load. The current $I_s$ serves as a replacement current when $I_b$ becomes very small during a low loading conditions, to ensure a bias current through the source follower while allowing the pass element $T_{pass}$ to shut off. This aspect of the invention ensures low quiescent power consumption.

$R_1$ is used to set a normal bias point for node $V_2$ in the linear operating range of $T_{pass}$ and to keep the pole at a frequency sufficiently higher than the UGB to ensure stable operation. The resistor $R_1$ is also used to keep the power supply rejection of the linear regulator low. If VDD1 changes, node $V_2$ will track this movement and force $V_3$ to move in the same manner to keep the base-emitter voltage of $T_{pass}$ constant. As noted above, VDD2 and VDD1 could be the same potential, but can be different if the voltage VDD2 for the OpAmp needs to be larger or smaller than VDD1.

Figure 3:
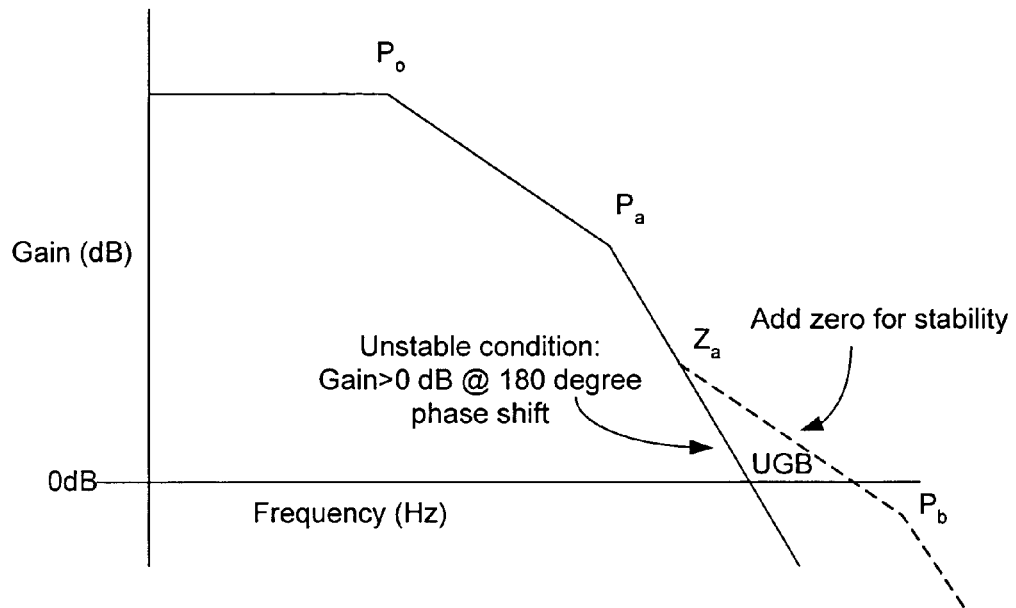
FIG. 3 shows a Bode plot of a conventional linear regulator circuit.

A key aspect of the invention, as embodied in the illustrative circuit of FIG. 3, is to keep the resulting bandwidth from the combined effect of the nodes $V_f$, $V_1$, $V_2$, $V_3$ and the OpAmp approximately a factor of 10 higher than the UGB to maintain stability. With the illustrative circuit shown, keeping the bandwidths at these levels is reasonably achievable. Also, circuits according to the invention do not require a large amount of silicon area to implement and do not draw a large amount of current during operation. In fact, the OpAmp could be a series of OpAmps with several additional internal nodes, provided that the bandwidth of the nodes are sufficiently high.

As a final observation, consideration with any linear regulator of the equivalent series inductance (ESL) needs to be understood. The resonance of the capacitor $C_1$ is determined by the capacitance and ESL. The resonance of the capacitor should be chosen to be higher than the UGB.

Figure 5A:
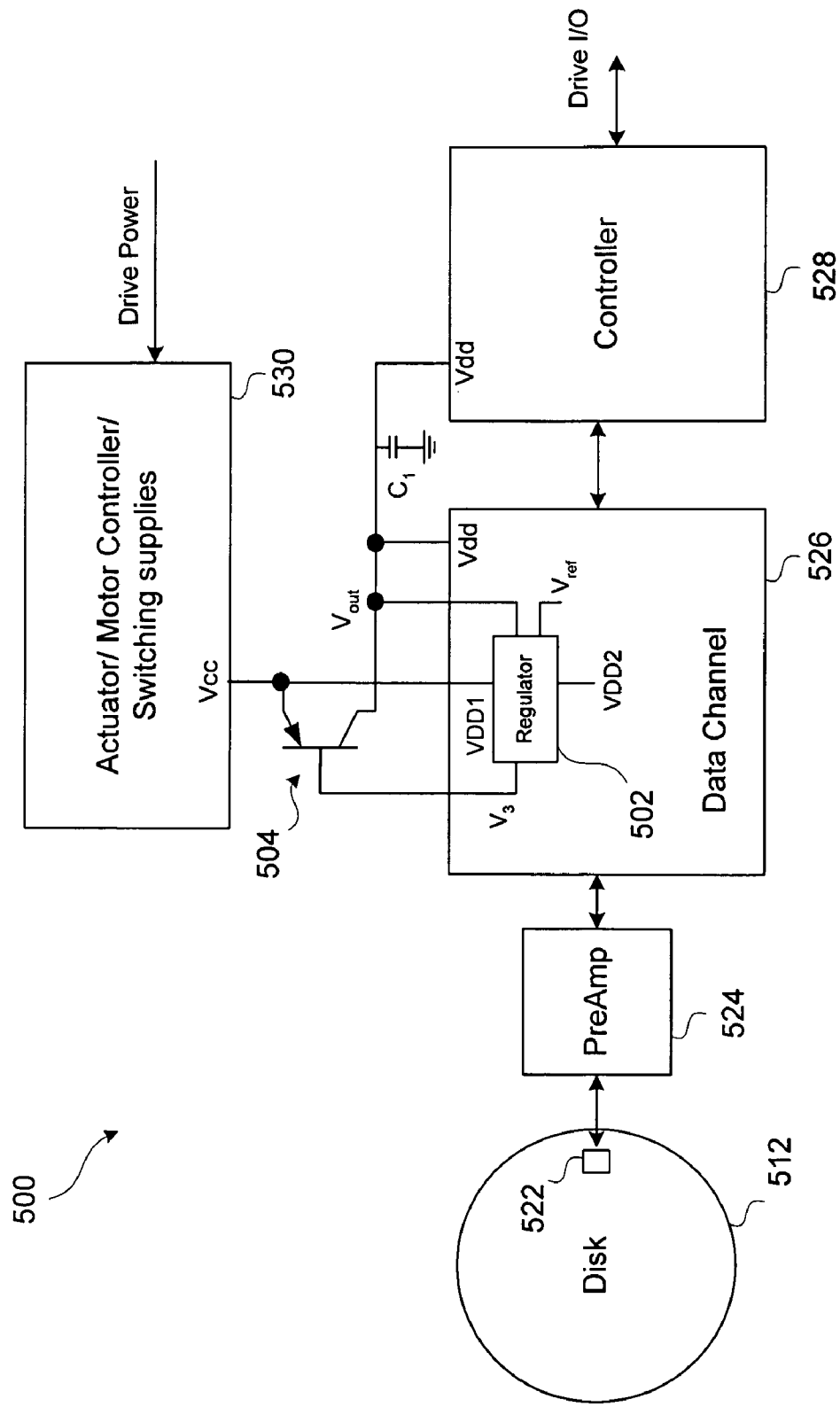
FIG. 5A shows a disk drive system which incorporates a linear voltage regulator according to the invention.

Generally, a linear voltage regulator circuit according to the present invention, can be used in many electronic circuits which require a regulated voltage. FIG. 5A shows an example of the present invention as embodied in an electronic device. In particular, a hard disk drive system 500 is shown. Typical components include a magnetic head component 522 for reading tracks of data from a disk 512. A signal representing the modulated light signal is sensed by a pre-amp circuit 524 and delivered to a data channel 526. Main power from a computer (not shown) supplies power to the whole drive. However, the voltage requirements for the pre-amp circuit 524, the data channel 526, a controller 528, and a motor and actuator circuit 530, each have different supply level requirements, current draw, tolerance and voltage ripple requirements. Imbedded in the data channel 526 and the controller 528 typically are sensitive circuits such as phase-locked loops and signal processing circuitry which require tighter tolerance and less "noisy" supplies than the motor and actuator circuit 530, for example. In FIG. 5A, Vcc supplies power to a PNP transistor pass element 504, and may be provided by a switching power supply and will have a higher tolerance and ripple.

A linear regulator circuit 502 in accordance with the present invention is provided to control the pass element 504. The voltage nodes of 502 correspond to the same nodes as FIG. 1. The linear regulator circuit 502 of the present invention will supply a tighter tolerance and quieter supply to these sensitive circuits in the data channel and controller. The $V_{out}$ shown in FIG. 5A is the linear regulator output and supplies power to circuits 526 and 528 at Vdd. The voltage supply Vcc shown in FIG. 5A couples to the VDD1 supply of FIG. 1.

Providing VDD2 separate from VDD1 allows a lower voltage to be used for the pass element than for the opamp. For example, VDD2=3.3V is a typical power supply voltage for an opamp. However, typical HDD electronics can be driven at a lower voltage of 2.5 V. Thus, setting VDD1 to 2.5 V provides about a 0.8V drop in HDD supply voltage levels with corresponding drops in power loss and heat dissipation.

Figure 5B:
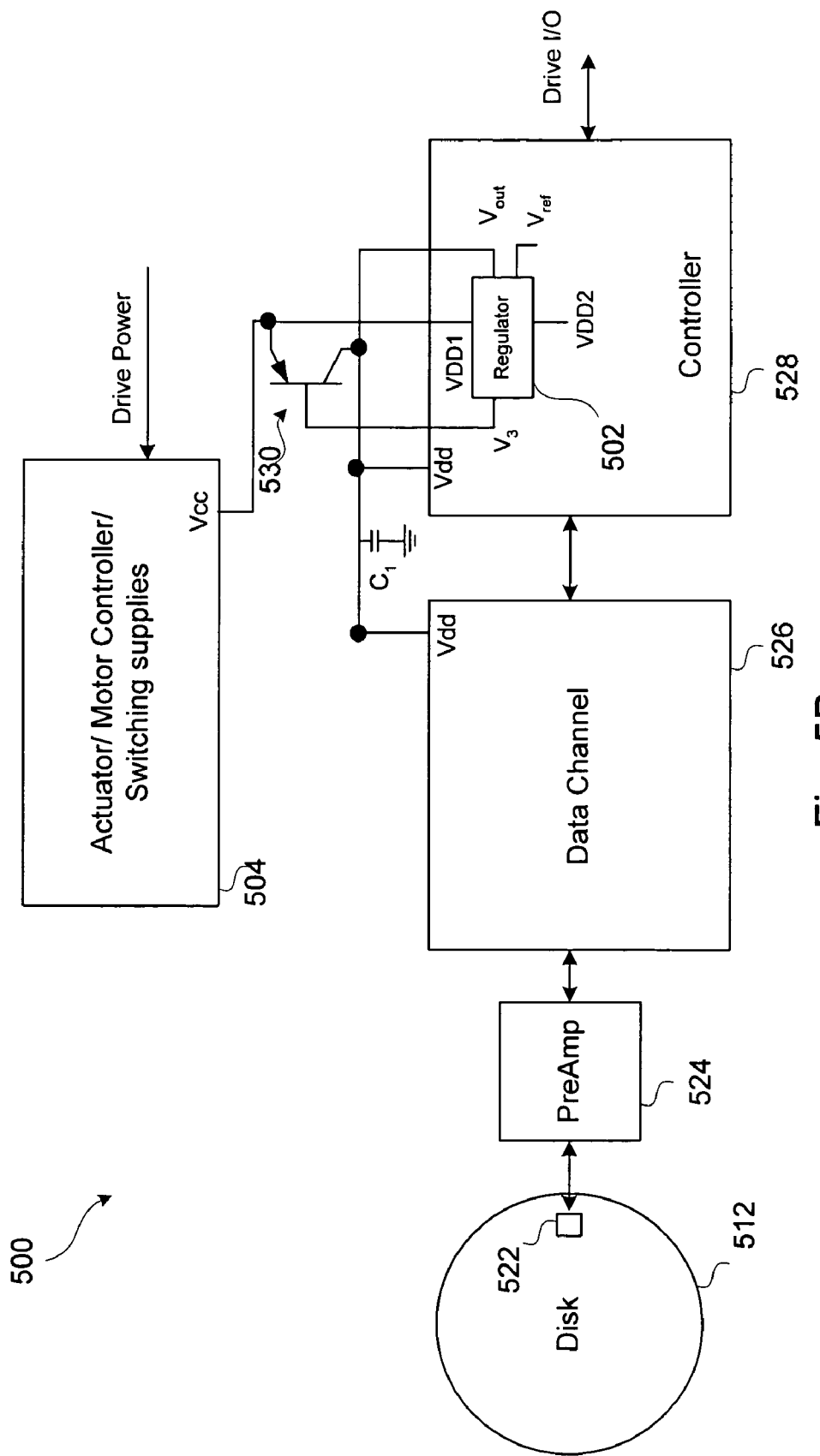
FIG. 5B shows another disk drive system which incorporates a linear voltage regulator according to the invention.

FIG. 5B illustrates another configuration of a hard disk drive system 500'. Here, the linear regulator circuit 502 is shown incorporated in the controller component 528.

What is claimed is:

1. A regulator circuit comprising:
   a circuit control node;
   a circuit output node to which a load can be connected, a voltage at said circuit output node being determined based on a voltage signal at said circuit control node;
   an amplifier circuit having a first amplifier input and a second amplifier input, and further having an amplifier output, said first amplifier input configured for receiving a reference voltage, said amplifier circuit receiving power from a first voltage source;
   a source follower circuit having a source follower input node and a source follower output, said amplifier output configured to drive said source follower input node, said source follower output coupled to said circuit control node;
   a series-connected resistor and transistor circuit coupled to provide a bias at said source follower input node, said amplifier output coupled to a control node of said transistor, said amplifier output thereby driving said source follower via said series-connected resistor and transistor circuit; and
   a feedback circuit coupled between said circuit output node and said second amplifier input.

2. The circuit of claim 1 wherein said transistor is a component of a current mirror circuit.

3. The circuit of claim 2 wherein said resistor is coupled between a second voltage source and said source follower input node.

4. The circuit of claim 3 wherein said first voltage source is substantially the same potential as the second voltage source.

5. The circuit of claim 3 wherein said first voltage source is different from the second voltage source.

6. The circuit of claim 1 wherein said source follower circuit comprises a transistor element in series connection with a current source.

7. The circuit of claim 1 wherein said amplifier circuit comprises a single op amp component.

8. The circuit of claim 1 wherein said amplifier circuit comprises two or more op amp components.

9. The circuit of claim 1 wherein said feedback path comprises a pair of resistor components configured as a voltage divider.

10. The circuit of claim 1 wherein a pass element having a control node can be connected to said circuit control node, wherein an output node of said pass element can be connected to said circuit output node, whereby said pass element can provide a regulated output voltage at its output node to said load.

11. The circuit of claim 10 wherein a second voltage source different from said first voltage source can be connected to said load via said pass element, thereby providing a voltage to said load that is independent of said first voltage source.

12. A circuit comprising:
    a first circuit node;
    a second circuit node, wherein a voltage level thereat varies in accordance with a voltage level of said first circuit node;
    an error amplifier having a first amplifier input configured to be coupled to a reference voltage, having a second amplifier input, and having an amplifier output, said error amplifier configured to receive power from a first voltage source;
    a gain stage comprising a source follower circuit in electrical communication with said amplifier output and with said first circuit node;
    a series-connected resistor and transistor coupled to provide a bias to said gain stage, said amplifier output coupled to a control node of said transistor; and
    a feedback path coupled between said second node and said second circuit amplifier input, said feedback path including a pair of resistors configured as a voltage divider.

13. The circuit of claim 12 wherein said gain stage comprises a first transistor component in series with a current source and having a control terminal, said bias being applied to said control terminal, said amplifier output configured thereby driving said control terminal via said series-connected resistor and transistor.

14. The circuit of claim 13 wherein said resistor is coupled between a second voltage source and said control terminal.

15. The circuit of claim 13 wherein said transistor is a component in a current mirror.

16. The circuit of claim 15 wherein said current mirror comprises said transistor and a second transistor component, each having a control node connected to said amplifier output, each having a first terminal at ground potential, said second transistor component having a second terminal connected to said first node, said transistor having a second terminal connected to said control node of said first transistor component.

17. The circuit of claim 14 wherein said first voltage source and said second voltage source are substantially of equal DC (direct current) voltage levels.

18. The circuit of claim 14 wherein said first voltage source and said second voltage source have different DC voltage levels.

19. The circuit of claim 12 wherein said second circuit node provides a feedback voltage that varies with a voltage across an external load that is coupled thereto.

20. The circuit of claim 12 wherein a pass element having a control node and can be connected to said first circuit node, wherein a output node of said pass element can be connected to said second circuit node, whereby said pass element can provide a regulated output voltage at its output node to a load connected thereto.

21. The circuit of claim 20 wherein a second voltage source different from said first voltage source can be connected to said load via said pass element, thereby providing a voltage to said load that is independent of said first voltage source.

22. A method for regulating an output voltage level of a circuit output node of an electric circuit comprising:

detecting said output voltage level;
producing an error signal based on a comparison of said output voltage level relative to a reference voltage;
controlling a source follower circuit with said error signal to produce a source follower output, including driving a series-connected resistor and transistor pair with said error signal to produce a bias level, and setting a DC operating point of said source follower circuit by applying said bias level to said source follower circuit; and
varying said output voltage level based on said source follower output,
wherein a transfer function of said electric circuit is characterized by having a pole at a frequency greater than the unity gain frequency of said electric circuit.

23. The method of claim 22 wherein said resistor element is coupled to a first voltage source.

24. The method of claim 23 further comprising controlling a pass circuit with said source follower output to produce said output voltage level.

25. The method of claim 24 wherein controlling said pass circuit with includes applying said source follower output to a control node of said pass circuit, said pass circuit being powered by a second voltage source, wherein a pole at said control node of said pass circuit varies with a pole at said circuit output node.

26. The method of claim 25 wherein said first voltage level is different from said second voltage level.

27. A voltage regulator circuit comprising:
first means for detecting an output voltage level;
second means for producing an error signal based on a comparison of said output voltage level relative to a reference voltage, said second means coupled to a first voltage source;
a series-connected resistor and transistor pair configured to produce a bias by controlling said transistor with said error signal; and
a source follower circuit biased by said series-connected resistor and transistor pair to produce a source follower output,
wherein said output voltage level is varied in response to variances in said source follower output,
wherein a transfer function of said circuit is characterized by having a pole at a frequency greater than the unity gain frequency of said circuit.

28. The circuit of claim 27 wherein said source follower output can be connected to a pass element that is connected to a second voltage source, wherein an output of said pass element constitutes said output voltage.

29. The circuit of claim 27 wherein said resistor is connected between said first voltage source and said source follower circuit.

* * * * *